(12) United States Patent
Jin et al.

(10) Patent No.: US 10,596,797 B2
(45) Date of Patent: Mar. 24, 2020

(54) FILM AND DEVICE FOR TEARING FILM

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xuequan Jin, Beijing (CN); Yachao Tong, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 78 days.

(21) Appl. No.: 15/562,764

(22) PCT Filed: Mar. 29, 2017

(86) PCT No.: PCT/CN2017/078531
§ 371 (c)(1),
(2) Date: Sep. 28, 2017

(87) PCT Pub. No.: WO2018/018911
PCT Pub. Date: Feb. 1, 2018

(65) Prior Publication Data
US 2018/0354250 A1    Dec. 13, 2018

(30) Foreign Application Priority Data

Jul. 29, 2016    (CN) .......................... 2016 2 0816458

(51) Int. Cl.
*B32B 43/00*    (2006.01)
*B32B 3/08*    (2006.01)
(Continued)

(52) U.S. Cl.
CPC .............. *B32B 43/006* (2013.01); *B32B 3/08* (2013.01); *B32B 7/025* (2019.01);
(Continued)

(58) Field of Classification Search
CPC ........................ B32B 7/025; B65H 2701/1724
See application file for complete search history.

(56) References Cited

U.S. PATENT DOCUMENTS 6,472,037 B1 * 10/2002 Kane ........................ A47G 1/17
148/300
8,358,066 B1 * 1/2013 Aurongzeb ......... H01L 51/5253
313/512

(Continued)

FOREIGN PATENT DOCUMENTS

CN    1426056 A    6/2003
CN    103693421 A    4/2014

(Continued)

OTHER PUBLICATIONS

International Search Report and Written Opinon dated Jul. 10, 2017; PCT/CN2017/078531.

(Continued)

*Primary Examiner* — Mark A Osele

(57) ABSTRACT

A film and a device for tearing film. The film includes a film body and a first protection film, and the first protection film includes a first magnetic part. Thus, the first protection film of the film can be torn off and removed by magnetic force, without contacting with the film by using adhesive tape, thereby avoiding a problem of failure of capturing the adhesive tape due to limited precision of the mechanical arm transmission, so that success rate of tearing film is improved and a problem of damaging the film body due to too large press force is avoided.

17 Claims, 3 Drawing Sheets

(51) Int. Cl.
*B32B 7/025* (2019.01)
*H01L 51/52* (2006.01)

(52) U.S. Cl.
CPC .... *H01L 51/5253* (2013.01); *B32B 2457/206* (2013.01); *B65H 2701/1724* (2013.01); *Y10T 156/1168* (2015.01); *Y10T 156/1978* (2015.01)

(56) References Cited

U.S. PATENT DOCUMENTS

| | | | |
|---|---|---|---|
| 2003/0000635 A1 | 1/2003 | Anker | |
| 2003/0211652 A1 | 11/2003 | Summers | |
| 2004/0013444 A1 | 1/2004 | De Kesel et al. | |
| 2004/0168764 A1 | 9/2004 | Anker | |
| 2005/0064167 A1 | 3/2005 | Mao et al. | |
| 2005/0179029 A1 | 8/2005 | Furukawa et al. | |
| 2006/0063015 A1* | 3/2006 | McCormick | C23C 14/08 428/457 |
| 2010/0007625 A1 | 1/2010 | Jiang et al. | |
| 2010/0109199 A1 | 5/2010 | Krishnan et al. | |
| 2010/0154992 A1 | 6/2010 | Feinstein et al. | |
| 2014/0150859 A1 | 6/2014 | Zakhidov et al. | |
| 2014/0158306 A1* | 6/2014 | Lu | B32B 43/006 156/752 |
| 2014/0209250 A1 | 7/2014 | Kawagoe et al. | |
| 2018/0226609 A1* | 8/2018 | Li | H01L 51/003 |
| 2018/0375054 A1* | 12/2018 | Wang | H01L 51/0097 |

FOREIGN PATENT DOCUMENTS

| | | | |
|---|---|---|---|
| CN | 204278701 U | 4/2015 | |
| CN | 26067049 U | 4/2017 | |
| FR | 2339223 A1 * | 8/1977 | ............... G09F 1/12 |
| GB | 230456 A * | 6/1926 | ............... C25D 1/04 |
| KR | 10-1188986 B1 | 9/2012 | |
| WO | 2012/161501 A2 | 11/2012 | |

OTHER PUBLICATIONS

The First Chinese Office Action dated Aug. 3, 2018; Appln. No. 201710187271.6.

The Second Chinese Office Action dated Mar. 5, 2019; Appln. No. 201710187271.6.

USPTO NFOA dated Dec. 28, 2018 in connection with U.S. Appl. No. 15/824,577.

USPTO NFOA dated Apr. 4, 2019 in connection with U.S. Appl. No. 15/824,577.

* cited by examiner

FILM AND DEVICE FOR TEARING FILM

Embodiments of the present disclosure relate to a film and a device for tearing film.

BACKGROUND

In the manufacturing process of a liquid crystal display (LCD) panel and an organic light emitting diode (OLED) display panel, protection films are often used to protect film layers which are required to be protected.

For example, in a package process of an organic light emitting diode (OLED) display panel with a large size, adhesive material of thermosetting type which is employed in surface packaging process has three layers. A first layer is a protection film of adhesive material, a second layer is a package adhesive film and a third layer is a protection film of adhesive material. Accordingly, a device for tearing film is used to tear off and remove the package protection films, when film layers required to be protected are used.

A technique of tearing film of prior art is to capture adhesive tape, move it to a setting position and press it on thin film to be torn to make it adhere to the thin film to be torn, by a mechanical arm. The thin film to be torn is pulled up and torn off by moving the mechanical arm by means of adhesive force between the adhesive tape and the thin film to be torn.

SUMMARY

Embodiments of the present disclosure provide a film and a device for tearing film. The film comprises a film body and a first protection film provided on the film body, and the first protection film comprises a first magnetic part. Thus, the first protection film of the film can be torn off and removed by a magnetic force, without contacting the film by using adhesive tape, thereby avoiding a problem of failure of capturing the adhesive tape due to limited precision of the mechanical arm transmission, so that success rate of tearing film is improved and a problem of damaging the film body due to too large press force is avoided.

At least one embodiment of the present disclosure provides a film, comprising: a film body and a first protection film, provided on the film body, wherein the first protection film comprises a first magnetic part.

For example, in an example of the present disclosure, in the film, the first magnetic part is at least provided on an edge of the first protection film.

For example, in an example of the present disclosure, the film further comprises a second protection film, the second protection film is provided on a side of the film body opposite to the first protection film, an adhesive force between the second protection film and the film body is larger than an adhesive force between the first protection film and the film body, and the second protection film comprises a second magnetic part.

For example, in an example of the present disclosure, in the film, the second magnetic part is provided corresponding to the first magnetic part.

For example, in an example of the present disclosure, in the film, the first magnetic part comprises a magnetic material and the second magnetic part comprises a magnetic material.

At least one embodiment of the present disclosure provides a device for tearing film, comprising: a bearing station, configured to bear film, wherein the film comprises a film body and a first protection film provided on the film body, and the first protection film comprises a first magnetic part; and an attraction platform, provided above the bearing station, the attraction platform comprises a magnetic force generation apparatus, configured to generate a magnetic force and attract the first magnetic part of the first protection film.

For example, in an example of the present disclosure, the device for tearing film further comprises a movement mechanism, the bearing station is provided on the movement mechanism and the movement mechanism is configured to make the bearing station movable.

For example, in an example of the present disclosure, the device for tearing film further comprises an alignment mechanism, provided on the bearing station and configured to align the film with the bearing station.

For example, in an example of the present disclosure, in the device for tearing film, the alignment mechanism comprises an infrared radiator or a camera.

For example, in an example of the present disclosure, in the device for tearing film, the magnetic force generation apparatus comprises a permanent magnet or sensing coils.

For example, in an example of the present disclosure, in the device for tearing film, the bearing station further comprises an attraction mechanism provided on the bearing station.

For example, in an example of the present disclosure, in the device for tearing film, the film further comprises a second protection film provided on a side of the film body opposite to the first protection film, an adhesive force between the second protection film and the film body is larger than an adhesive force between the first protection film and the film body, the second protection film comprises a second magnetic part, and the attraction mechanism comprises a magnetic force attraction apparatus.

For example, in an example of the present disclosure, in the device for tearing film, the magnetic force attraction apparatus is sensing coils, the bearing station further comprises a sensing switch, the sensing switch is provided on an end of the bearing station close to the attraction platform and the sensing switch is configured to sense the attraction platform and enable the magnetic force attraction apparatus.

For example, in an example of the present disclosure, in the device for tearing film, the attraction platform further comprises a substrate carrying part configured to carry a substrate to be adhered with a film

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used in the disclosure have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1A:
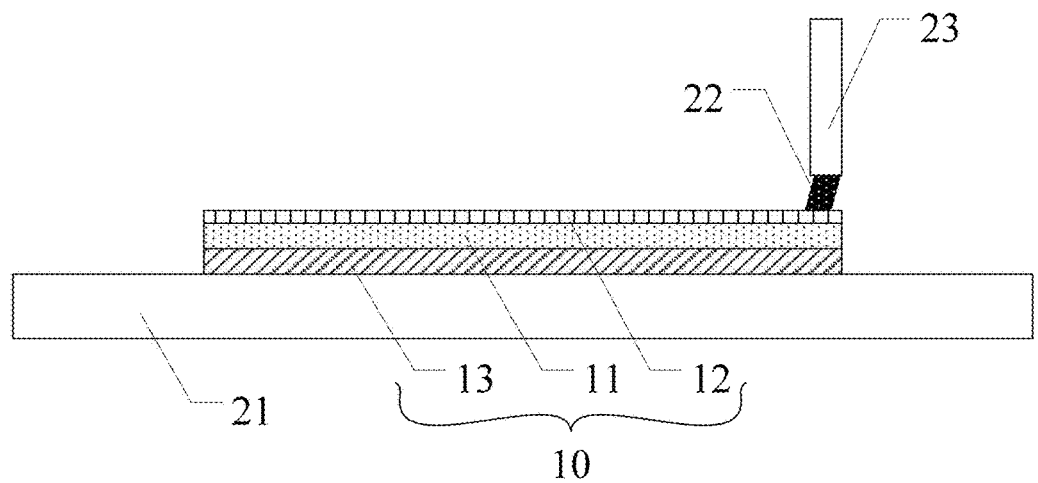
FIGS. 1a-1b are schematic diagrams of tearing a film by a device for tearing film.
Figure 1B:
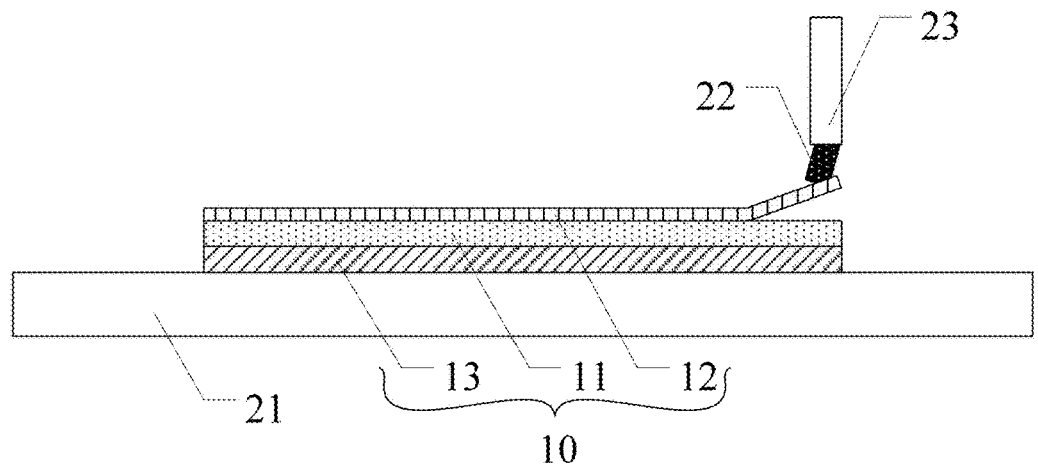

FIGS. 1a and 1b are schematic diagrams of tearing film by a device for tearing film. As illustrated in FIG. 1a, film 10 comprises a film body 11, a first protection film 12 provided above the film body 11 and a second protection film 13 provided under the film body 11. The device for tearing film comprises a bearing station 21 which bears the film 10; an adhesive tape 22 which adheres the protection film (e.g. the first protection film 12 or the second protection film 13) of the film; and a mechanical arm which captures the adhesive tape, and tears off and removes the protection film by using the adhesive tape. As illustrated in FIGS. 1a and 1b, an usual method of tearing film comprises: capturing the adhesive tape 22 and moving it to a setting position above the film 10 by using the mechanical arm 23; pressing the film tape 22 downwards and adhering the first protection film 12 by adhesiveness by using the mechanical arm 23; and pulling up the adhesive tape 22, and tearing off and removing the first protection film 12 by using the mechanical arm 23. However, in study, inventor(s) of the present disclosure notices that: due to limited precision of the mechanical arm transmission, positions where the mechanical arm displaces are different every time, so that positions where the mechanical arm captures the adhesive tape are slightly different every time, and thus the device for tearing film cannot capture successfully every time, thereby affecting the success rate of tearing film. Different batches of adhesive tapes have different characteristics (e.g. adhesiveness) and thus need different press forces to ensure that the first protection film can be adhered successfully. Too small press force will result that the first protection film cannot be pulled up, and too large press force will result that the film body is damaged. Therefore, setting of the press force will also affect the success rate of tearing film of the device for tearing film. Further, a direction along which the mechanical arm pulls up will also affect the success rate of tearing film, and setting of the direction of pulling up is complicated, which results that tearing film will be failed due to a small deviation of the direction of pulling up.

Embodiments of the present disclosure provide a film and a device for tearing film. The film comprises a film body and a first protection film provided on the film body, and the first protection film comprises a first magnetic part. The device for tearing film comprises a bearing station which is configured to bear the film; and an attraction platform which is provided above the bearing station. The attraction platform comprises a magnetic force generation apparatus which is configured to generate a magnetic force and attract the magnetic part of the first protection film. Thus, the device for tearing film can tear off and remove the first protection film of the film by a magnetic force, without contacting the film by using the adhesive tape, thereby avoiding a problem of failure of capturing the adhesive tape due to limited precision of the mechanical arm transmission, so that success rate of tearing film is improved and the problem of damaging the film body due to too large press force is avoided.

Hereafter, the film and the device for tearing film provided by embodiments of the present disclosure will be described in detail with reference to the accompanying drawings.

First Embodiment

Figure 2:
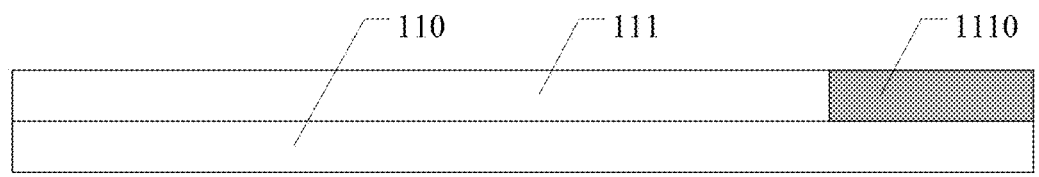
FIG. 2 is a structural schematic diagram of a film provided by an embodiment of the present disclosure.

This embodiment provides a film. As illustrated in FIG. 2, the film comprises a film body 110 and a first protection film 111 provided on the film body 110, and the first protection film 111 has a first magnetic part 1110.

In the film provided by this embodiment, the first protection film 111 has a first magnetic part 1110 and the first magnetic part 1110 has magnetism. Thus, the first magnetic part 1110 can be attracted by a magnetic force, so as to attract the first protection film 111, to further tear off and remove the first protection film 111 from the film body 110. Because the first magnetic part 1110 can be attracted by a magnetic force, an adhesive tape is not required to contact the film, thereby avoiding a problem of failure of capturing the adhesive tape due to limited precision of the mechanical arm transmission, so that success rate of tearing film is improved. On the other hand, because the magnetic force can be generated by induction coils, the size of the magnetic force can be flexibly controlled by controlling the size of the current, so as to adaptively realize efficiently tearing films of different batches. For example, upon the set magnetic force being too small to attract the first magnetic part 1110, a control circuit connected with the induction coils can increase the current passing through the induction coils immediately, to increase size of the magnetic force so as to attract the first magnetic part 1110.

For example, in the film provided by an example of the present embodiment, as illustrated in FIG. 2, the first magnetic part 1110 is provided on an edge of the first protection film 111. Thus, when the first magnetic part 1110 is attracted and pulled up by magnetic force, the first protection film 111 can be torn off along a direction from the edge to a center of the first protection film 111, so that the first protection film can be torn off and removed easily. It should be noted that, the first magnetic part can be provided on an edge of a side of the first protection (an edge of the right side is illustrated as an example in FIG. 2), and also can be provided on edges of other sides of the first protection film. For example, upon a main surface of the first protection film having a rectangular shape, the first magnetic part can be only provided at one of four edges of the first protection film, and can be also provided on other edge of the four edges of the first protection film. Of course, the disclosure comprises but is not limited thereto, and the first magnetic part can also be provided on other positions of the first protection film.

Figure 3:
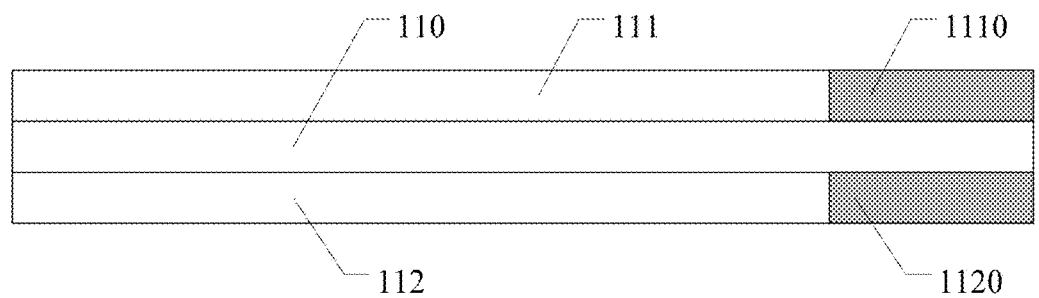
FIG. 3 is a structural schematic diagram of another film provided by an embodiment of the present disclosure.

For example, in the film provided by an example of the present embodiment, as illustrated in FIG. 3, the film further comprises a second protection film 112 provided on a side of the film body 110 opposite to the first protection film 111, i.e. a second protection film 112 provided under the film body 110 in FIG. 3. The second protection film 112 further comprises a second magnetic part 1120. An adhesive force between the second protection film 112 and the film body 110 is larger than an adhesive force between the first protection film 111 and the film body 110. Because the second protection film 112 has the second magnetic part 1120 and the second magnetic part 1120 has magnetism, upon a magnetic force being used to remove the first protection film 111, the film can be fixed by attracting the second magnetic part 1120, to prevent the film from being removed. Of course, upon removing the second protection film 112, a magnetic force can be used to tear and remove the second protection film 112.

For example, in the film provided by an example of the present embodiment, as illustrated in FIG. 3, the second magnetic part 1120 is provided on an edge of the second protection film 112. Thus, upon the second magnetic part 1110 being attracted by a magnetic force, the second protection film 112 can be torn off and removed easily. It should be noted that, the second magnetic part can be provided on an edge of a side of the second protection (an edge of the right side is illustrated as an example in FIG. 3), and also can be provided on edges of other sides of the first protection film. For example, upon a main surface of the second protection film having a rectangular shape, the second magnetic part can be only provided at one of four edges of the second protection film, and can also be provided at other edges of the four edges of the second protection film.

For example, in the film provided by an example of the present embodiment, as illustrated in FIG. 3, the second magnetic part 1120 is provided correspondingly to the first magnetic part 1110, i.e. an orthogonal projection of the second magnetic part 1120 on the film body 110 at least partially overlap an orthogonal projection of the first magnetic part 1110 on the film body 110. Thus, upon the first magnetic part 1110 being attracted by a magnetic force, the film is prevented from displacing by applying a magnetic force to the second magnetic part 1120. Furthermore, the second magnetic part 1120 is provided correspondingly to the first magnetic part 1110. Accordingly, the magnetic force to attract the second magnetic part 1120 can be set smaller and the effect to prevent the film from displacing is better.

For example, in the film provided by an example of the present embodiment, the first magnetic part comprises a magnetic material and the second magnetic part comprises a magnetic material. For example, the magnetic material can comprise iron, cobalt or nickel.

Second Embodiment

Figure 4:
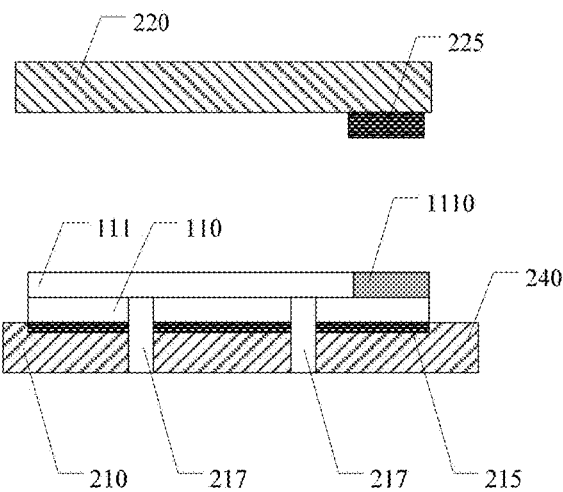
FIG. 4 is a structural schematic diagram of a device for tearing film provided by an embodiment of the present disclosure.

This embodiment provides a device for tearing film. As illustrated in FIG. 4, the device for tearing film comprises a bearing station 210 and an attraction platform 220. The bearing station is configured to bear film 100, and the attraction platform 220 is provided to a side of the bearing station 210 where the bearing station 210 bears the film 100. The attraction platform is movable relative to the bearing station 210, and the attraction platform 220 comprises a magnetic force generation apparatus 224 and the magnetic force generation apparatus can generate magnetic force.

In the device for tearing film provided by this embodiment, the attraction platform 220 comprises the magnetic force generation apparatus 225, and thus the protection film with magnetic substance on the film 100 can be attracted by the magnetic force generated from the magnetic force generation apparatus 22, and the protection film can be torn off and removed by the relative movement between the attraction platform 220 and the bearing station 210. The device for tearing film provided by this embodiment employs a magnetic force to tear film, without contacting film by using the adhesive tape, thereby avoiding a problem of failure of capturing the adhesive tape due to limited precision of the mechanical arm transmission. On the one hand, success rate of tearing film can be improved, on the other hand, consumption of consumable materials such as adhesive taps etc. is reduced. Further, because the magnetic force generation apparatus can employ sensing coils, the size of the magnetic force generated by the magnetic force generation apparatus can be flexibly controlled by controlling the size of the current, so as to adaptively realize efficiently tearing films of different batches, so as to further improve the success rate of tearing a film. For example, upon the set magnetic force being too small to attract a protection film with magnetic substance, a control circuit connected with the induction coils can increase the current passing through the induction coils immediately, to increase size of the magnetic force so as to attract the protection film with magnetic substance.

In the device for tearing film provided by an example of the present embodiment, as illustrated in FIG. 4, the film 100 can comprises a film body 110 and a first protection film 111 provided on the film body 110. In addition, the first protection film 111 comprises a first magnetic part 1110. The magnetic force generation apparatus 225 of the attraction platform 200 can generate a magnetic force and attract the first magnetic part 1110 of the first protection film 111. Then, the first protection film 111 is torn off and removed from the film body 110 by the relative movement between the bearing station 210 and the attraction platform 220. For example, the attraction platform 220 can move downwards along a direction perpendicular to the bearing station 210, so as to make the magnetic force generation apparatus 225 approach the first magnetic part 1110, and then the attraction platform 220 can move upwards along the direction perpendicular to the bearing station 210, to tear off and remove the first protection film 111 with the first magnetic part 1110. It should be noted that, this disclosure comprises but is not limited thereto. The device for tearing film provided by this embodiment can implement tearing off and removing the first protection film by other manners of relative movements.

For example, in the film provided by this embodiment, the magnetic force generation apparatus 225 comprises a permanent magnet or induction coils. The permanent magnet can generate attraction forces to the magnetic material and the induction coils can generate attraction forces to the magnetic material by applying a current.

For example, in the device for tearing film provided by an example of the present embodiment, the attraction platform can comprise a propulsion mechanism (not shown in figures). The attraction platform is movable relative to the bearing station by the propulsion mechanism, so that the first protection film is torn off and removed from the film body after the first magnetic part is attracted by the magnetic force generation apparatus.

For example, the propulsion mechanism can comprise at least one of a cylinder and an electric motor.

For example, in the device for tearing film provided an example of the present embodiment, as illustrated in FIG. 4, the bearing station 210 further comprises an attraction mechanism 215. The attraction mechanism 215 is configured to attract a film. Thus, upon the first magnetic part being attracted by the magnetic force generation apparatus, the film body will not be attracted by the magnetic force generation apparatus at the same time because of the attraction effect of the attraction mechanism provided on the bearing station. For example, the attraction mechanism can comprise a vacuum attraction apparatus.

A Third Embodiment

Figure 5:
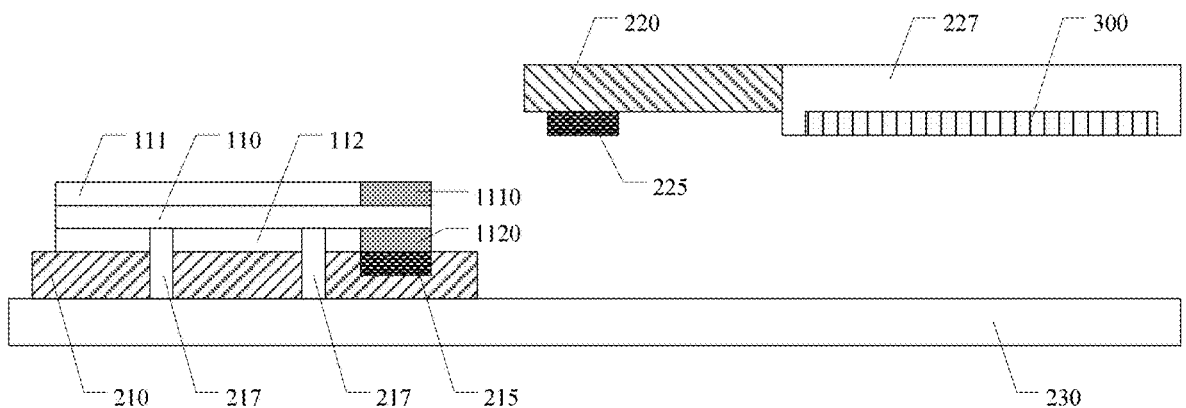
FIG. 5 is a structural schematic diagram of another device for tearing film provided by an embodiment of the present disclosure.

This embodiment provides a device for tearing film. As illustrated in FIG. 5, the device for tearing film comprises a bearing station 210 and an attraction platform 220. The bearing station 210 is configured to bear film 100 and the attraction platform 220 is provided on a side of the bearing station 210 where the bearing station 210 bears the film 200. The attraction platform 220 is movable relative to the bearing station 210. The attraction platform 220 comprises a magnetic force generation apparatus 225 and the magnetic force generation 225 can generate a magnetic force. As illustrated in FIG. 5, the device for tearing film further comprises a movement mechanism 230, the bearing station 210 is provided on the movement mechanism 230 and the movement mechanism 230 can make the bearing station 210 movable.

For example, the movement mechanism can comprise a slide rail.

In the device for tearing film provided by this embodiment, the attraction platform can keep static. The bearing station can move close to the attraction platform by the movement mechanism. Upon the bearing station moving to a position under the attraction platform, the magnetic force generation apparatus can generate magnetic force to attract the protection film with magnetic material of the film on the bearing station. Upon the bearing station continuing to move by the movement structure, the protection film can be removed by the relative movement between the bearing station and the attraction platform. The device for tearing film provided by this embodiment employs magnetic force to tear film, without contacting the film by using the adhesive tape, to avoid a problem of failure of capturing the adhesive tape due to limited precision of the mechanical arm transmission. On the one hand, success rate of tearing film can be improved, on the other hand, consumption of consumable materials such as adhesive tapes etc. is reduced. Because the magnetic force generation apparatus can employ coils, efficient tearing film can be adaptively made to different batches of films by controlling size of current to flexibly control size of the magnetic force, so as to further improve success rate of tearing film. In addition, the device for tearing film provided by this embodiment has a simple structure, and it is easy to maintain.

For example, in the device for tearing film provided by an example of the present embodiment, the film comprises film body 110 and a first protection film 111 provided on the film body 110. The first protection film 111 comprises a first magnetic part 1110; the magnetic force generation apparatus 225 can generate magnetic forces and attract the first magnetic part 1110 of the first protection film 1110. When the bearing station 210 moves continuously by the movement structure 230, the first protection film 111 can be removed by the relative movement between the bearing station 210 and the attraction platform 220.

For example, in the device for tearing film provided by an example of the present embodiment, the magnetic force generation apparatus comprises a permanent magnet or induction coils.

For example, in the device for tearing film provided by an example of the present embodiment, a plurality of bearing stations can be provided on the movement mechanism and the plurality of bearing stations moves to the attraction platform successively to realize continuously tearing films. It should be noted that, this disclosure comprises but is not limited thereto, the attraction platform can be movable as well.

For example, in the device for tearing film provided by an example of the present embodiment, as illustrated in FIG. 5, the device for tearing film further comprises an alignment mechanism 217 provided on the bearing station. The alignment mechanism 217 can be configured to align the film 100 with the bearing station 210. Thus, the film 100 can be precisely positioned on the bearing station 210 by the alignment mechanism 217, so as to improve precision of following processes. For example, as illustrated in FIG. 5, upon the first magnetic part 1110 being only provided on an edge of a side of first protection film 111, the first magnetic part 1110 can be located at an end of the attraction platform 220 close to the attraction platform by the alignment mechanism 217.

For example, in the device for tearing film provided by an example of the present embodiment, the alignment mechanism can comprise an infrared radiator or a camera.

For example, in the device for tearing film provided by an example of the present embodiment, as illustrated in FIG. 5, the bearing station can further comprise an attraction mechanism 215, and the attraction mechanism 215 is configured to attract a film. Thus, upon the first magnetic part being attracted by using the magnetic force generation apparatus, the film body will not be attracted by the magnetic force generation apparatus at the same time because of the effect of the attraction mechanism provided on the bearing station.

For example, in the film provided by an example of the present embodiment of the present disclosure, as illustrated in FIG. 3, the film 100 further comprises a second protection film 112 provided on a side of the film body 110 opposite to the first protection film 111. An adhesive force between the second protection film 112 and the film body 110 is larger than an adhesive force between the first protection film 111 and the film body 110. The second protection film 112 comprises the second magnetic part 1120 and the second magnetic part 215 comprises the magnetic force attraction mechanism 215. Thus, the second protection film 112 is attracted on the bearing station 210 by the magnetic force attraction mechanism 2150 provided on the bearing station 210. In addition, because the adhesive force between the second protection film 112 and the film body 110 is larger than the adhesive force between the first protection film 111 and the film body 110, the film body 110 will not be attracted by the magnetic force generation apparatus 225 together with the first magnetic part 110 because of the effect of the attraction mechanism 2150 provided on the bearing station 210, upon the first magnetic part 110 being attracted by using the magnetic force generation apparatus 225. It should be noted that, the attraction mechanism can not only comprise a magnetic attraction apparatus, but also comprise a vacuum attraction mechanism.

For example, the magnetic force attraction mechanism can employ a permanent magnet or induction coils.

For example, in the device for tearing film provided by an example of the present embodiment, as illustrated in FIG. 5, the attraction platform 220 further comprises a substrate carrying part 227, which is configured to carry a substrate to be adhered with a film 300. Accordingly, the bearing station 210 with film 100 firstly tears off and remove the first protection film 111 by the magnetic force generation apparatus 225 on the attraction platform 220, and then combines the substrate 300 to be adhered with a film and the film (film body 110) in which the first protection film 111 is removed by the substrate carrying part 227. It should be noted that the alignment mechanism 217 provided on the bearing station 210 can ensure that the film is placed precisely, so as to ensure precision of the combination of the substrate 300 to be adhered with a film and the film body 110 by using the substrate carrying part 227.

Figure 6:
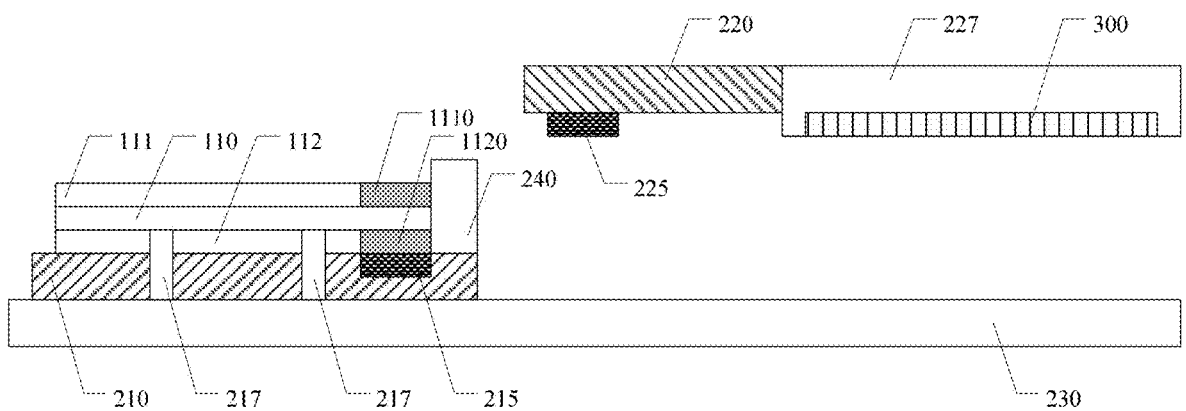
FIG. 6 is a structural schematic diagram of another device for tearing film provided by an embodiment of the present disclosure.

For example, in the device for tearing film provided by an example of the present embodiment, as illustrated in FIG. 6, the magnetic force attraction mechanism 2150 includes induction coils. The bearing station 210 further comprises a sensing switch 240, which is provided on an end of the attraction platform 220 close to the bearing station 210. Upon the bearing station 210 moving to a position under the attraction platform 220 by the movement structure 230, the sensing switch 240 senses the attraction platform and enables the magnetic force attraction apparatus 2150 (i.e. conducted), to attract the second magnetic part 1120. Thus, upon the bearing station 210 being not located below the attraction platform, the magnetic force attraction apparatus 2150 is not conducted, and thus attraction force to the second magnetic part 1120 will not be generated. On the one hand, energy consumption of the device for tearing film can be saved, on the other hand, a position of the film 100 on the bearing station 210 can be adjusted.

Figure 7:
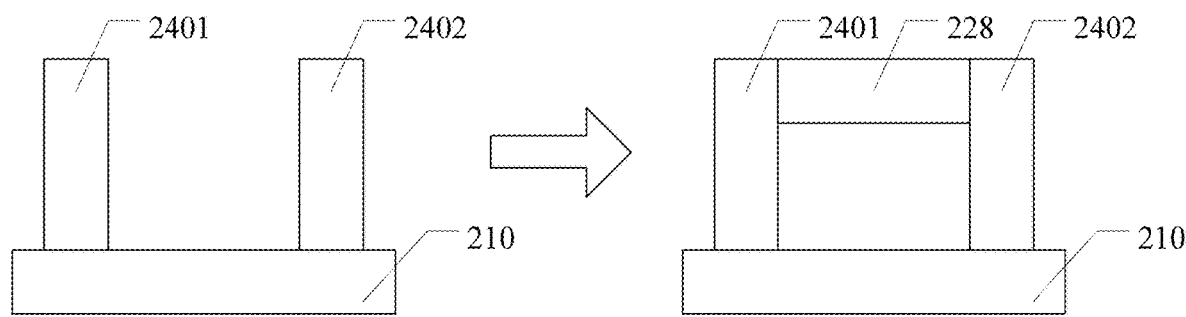
FIG. 7 is a structural schematic diagram of a sensing switch provided by an embodiment of the present disclosure.

For example, as illustrated in FIG. 7, the sensing switch 240 can comprise a first conduction part 2401 and a second conduction part 2402 which are provided opposite to each other. The first conduction part 2401 is connected with an electric power source, and the second conduction part 2402 can be connected with the magnetic force attraction apparatus 2150 (alternatively, the first conduction part 2401 is connected with the magnetic force attraction apparatus, and the second conduction part 2402 is connected with the electric power source). The attraction platform 220 is provided with a third conduction part 228 with a width corresponding to a distance between the first conduction part 2401 and the second conduction part 2402. When the bearing station 210 moves to position under the attraction platform 220, the third conduction part 228 passes between the first conduction part 2401 and the second conduction part 2402, and electrically connects the first conduction part 2401 and the second conduction part 2402, so that the magnetic force attraction apparatus 2150 is enabled. It should be noted that, the disclosure comprises and is not limited thereto, and the device for tearing film provided by this embodiment also can employ sensing switches in other forms. For example, an infrared radiator and a corresponding provided receiver are provided, and when the bearing station moves to a position under the attraction platform by the movement structure, the attraction platform passes between the infrared radiator and the corresponding provided receiver, emission and reception of the infrared is blocked. Accordingly, it can be decided a position of the attraction platform, so that the magnetic force attraction apparatus is conducted.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

The foregoing is only the preferred embodiments of the present disclosure and not intended to limit the scope of protection of the present disclosure. The scope of protection of the present disclosure should be defined by the appended claims.

The application claims priority to the Chinese patent application No. 201620816458.9, filed Jul. 29, 2016, the entire disclosure of which is incorporated herein by reference as part of the present application.

The invention claimed is:

1. A film, the film comprising:
 a film body; and
 a first protection film, provided on the film body, wherein the first protection film comprises a first magnetic part, the first magnetic part is only disposed on an edge of the first protection film,
 the film further comprises a second protection film the second protection film is provided on a side of the film body opposite to the first protection film an adhesive force between the second protection film and the film body is larger than an adhesive force between the first protection film and the film body, and the second protection film comprises a second magnetic part.

2. The film of claim 1, wherein an orthogonal projection of the second magnetic part on the film body at least partially overlap an orthogonal projection of the first magnetic part on the film body.

3. The film of claim 1, wherein the first magnetic part comprises magnetic material and the second magnetic part comprises magnetic material.

4. A device for tearing film, comprising:
 a bearing station, configured to bear film; and
 an attraction platform, provided on a side of the bearing station where the bearing station bears the film, wherein
 the attraction platform is movable relative to the bearing station, the attraction platform comprises a magnetic force generation apparatus, and the magnetic force generation apparatus is configured to generate magnetic force,
 the attraction platform further comprises a substrate carrying part configured to carry a substrate to be adhered with a film.

5. The device for tearing film of claim 4, wherein the film comprises a film body and a first protection film provided on the film body, and the first protection film comprises a first magnetic part.

6. The device for tearing film of claim 5, wherein the bearing station further comprises:
an attraction mechanism provided on the bearing station.

7. The device for tearing film of claim 6, wherein the film further comprises a second protection film provided on a side of the film body opposite to the first protection film, an adhesive force between the second protection film and the film body is larger than an adhesive force between the first protection film and the film body, the second protection film comprises a second magnetic part, and the attraction mechanism comprises a magnetic force attraction apparatus.

8. The device for tearing film of claim 7, wherein the magnetic force attraction apparatus is coils, the bearing station further comprises an sensing switch, the sensing switch is provided on an end of the bearing station close to the attraction platform and the sensing switch is configured to induce attraction platform and enable the magnetic force attraction apparatus.

9. The device for tearing film of claim 4, further comprising
a movement mechanism, wherein, the bearing station is provided on the movement mechanism and the movement mechanism is configured to make the bearing station movable.

10. The device for tearing film of claim 4, further comprising:
an alignment mechanism, provided on the bearing station and configured to align the film with the bearing station.

11. The device for tearing film of claim 10, wherein the alignment mechanism comprises an infrared radiator or a camera.

12. The device for tearing film of claim 4, wherein the magnetic force generation apparatus comprises a permanent magnet or coils.

13. A device for tearing film, comprising:
a bearing station, configured to bear film; and
an attraction platform, provided on a side of the bearing station where the bearing station bears the film, wherein
the attraction platform is movable relative to the bearing station, the attraction platform comprises a magnetic force generation apparatus, and the magnetic force generation apparatus is configured to generate magnetic force,
the magnetic force generation apparatus comprises a permanent magnet or coils,
the bearing station further comprises: an attraction mechanism provided on the bearing station,
the film further comprises a second protection film provided on a side of the film body opposite to the first protection film, an adhesive force between the second protection film and the film body is larger than an adhesive force between the first protection film and the film body, the second protection film comprises a second magnetic part, and the attraction mechanism comprises a magnetic force attraction apparatus,
the magnetic force attraction apparatus is coils, the bearing station further comprises an sensing switch, the sensing switch is provided on an end of the bearing station close to the attraction platform and the sensing switch is configured to induce attraction platform and enable the magnetic force attraction apparatus.

14. The device for tearing film of claim 13, further comprising
a movement mechanism, wherein, the bearing station is provided on the movement mechanism and the movement mechanism is configured to make the bearing station movable.

15. The device for tearing film of claim 13, further comprising:
an alignment mechanism, provided on the bearing station and configured to align the film with the bearing station.

16. The device for tearing film of claim 15, wherein the alignment mechanism comprises an infrared radiator or a camera.

17. The device for tearing film of claim 13, wherein the magnetic force generation apparatus comprises a permanent magnet or coils.

* * * * *